(12) United States Patent
Lin

(10) Patent No.: US 7,888,607 B2
(45) Date of Patent: Feb. 15, 2011

(54) THIN FILM CIRCUIT BOARD DEVICE

(75) Inventor: Chih-Tsung Lin, Taipei (TW)

(73) Assignee: Changshu Sunrex Technology Co., Ltd., Changshu (CN)

( * ) Notice: Subject to any disclaimer, the term of this patent is extended or adjusted under 35 U.S.C. 154(b) by 421 days.

(21) Appl. No.: 12/126,588

(22) Filed: May 23, 2008

(65) Prior Publication Data

US 2009/0288871 A1    Nov. 26, 2009

(51) Int. Cl.
*H01R 12/14*    (2006.01)
*H05K 1/11*    (2006.01)
(52) U.S. Cl. ........................ 174/262; 361/748
(58) Field of Classification Search ................. 361/680, 361/683, 686, 724–727; 174/262
See application file for complete search history.

(56) References Cited

U.S. PATENT DOCUMENTS 4,028,509 A * 6/1977 Zurcher ...................... 200/5 A
4,373,122 A * 2/1983 Frame ........................ 200/600
6,542,355 B1 * 4/2003 Huang .................... 361/679.08
6,661,650 B2 * 12/2003 Nakajima et al. ...... 361/679.09
6,853,544 B2 * 2/2005 Hsu ...................... 361/679.08
6,943,705 B1 * 9/2005 Bolender et al. .............. 341/33
7,535,699 B2 * 5/2009 Hamada et al. ........ 361/679.08

* cited by examiner

*Primary Examiner*—Yuriy Semenenko
(74) *Attorney, Agent, or Firm*—Harry K. Ahn; Abelman Frayne & Schwab

(57) ABSTRACT

A thin film circuit board device includes: a first thin film circuit board having a first protrusion provided with a first conductive contact; a second thin film circuit board having a second protrusion provided with a second conductive contact; and an insulator film disposed between the first and second thin film circuit boards. The first and second protrusions are disposed one above the other. The insulator film is free of a portion that extends between the first and second protrusions. The first and second protrusions are folded together in such a manner that the first and second conductive contacts are brought into contact with each other at the fold thereof.

3 Claims, 4 Drawing Sheets

THIN FILM CIRCUIT BOARD DEVICE

BACKGROUND OF THE INVENTION

1. Field of the Invention

The invention relates to a thin film circuit board device for a keyboard, more particularly to a thin film circuit board device including first and second thin film circuit boards with protrusions folded together to interconnect electrically the first and second thin film circuit boards.

2. Description of the Related Art

Referring to FIG. 1, a conventional thin film circuit board device 8 is to be installed in a keyboard (not shown) and is shown to include: a first thin film circuit board 81, a second thin film circuit board 82, and an insulator film 83 sandwiched between the first and second thin film circuit boards 81, 82. The first and second thin film boards 81, 82 include first and second conductive contacts 811, 821, respectively. The insulator film 83 has openings 831. For transmitting signals, the first and second conductive contacts 811, 821 are electrically connected to each other through a conductive paste (not shown) located in the openings 831 to bond adhesively the first and second conductive contacts 811, 821.

The conventional thin film circuit board device 8 is disadvantageous in that the conductive paste is likely to deteriorate after a period of time, which results in poor adhesion to bond the first and second conductive contacts 811, 821, which, in turn, results in disconnection between the first and second conductive contacts 811, 821.

SUMMARY OF THE INVENTION

Therefore, an object of the present invention is to provide a thin film circuit board device that can overcome the aforesaid drawback associated with the prior art.

Accordingly, a thin film circuit board device of the present invention comprises: a first thin film circuit board having a first protrusion provided with a first conductive contact; a second thin film circuit board having a second protrusion provided with a second conductive contact; and an insulator film disposed between the first and second thin film circuit boards. The first and second protrusions are disposed one above the other. The insulator film is free of a portion that extends between the first and second protrusions. The first and second protrusions are folded together in such a manner that the first and second conductive contacts are brought into contact with each other at the fold thereof.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
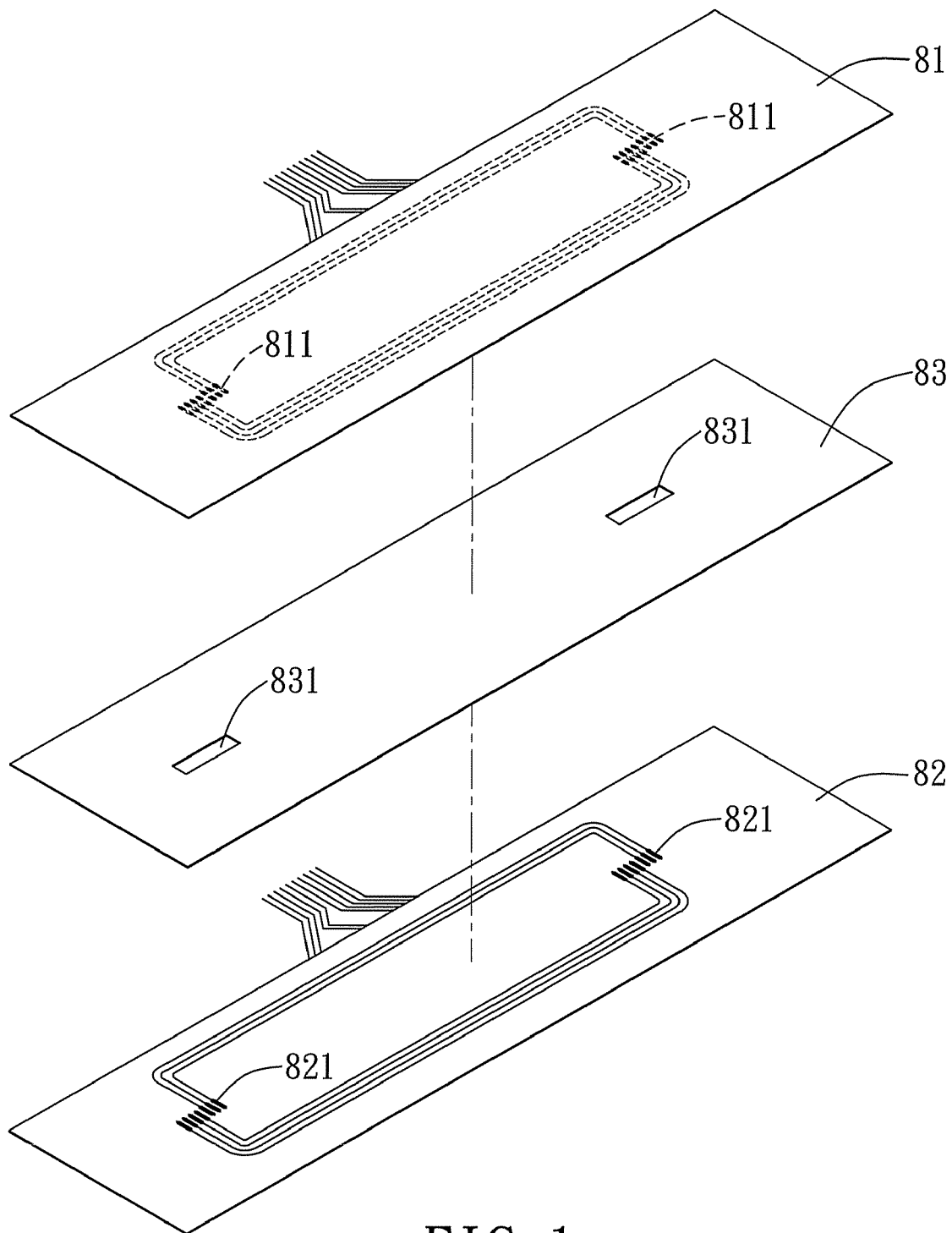
FIG. 1 is an exploded perspective view of a conventional thin film circuit board device for a keyboard.
Figure 2:
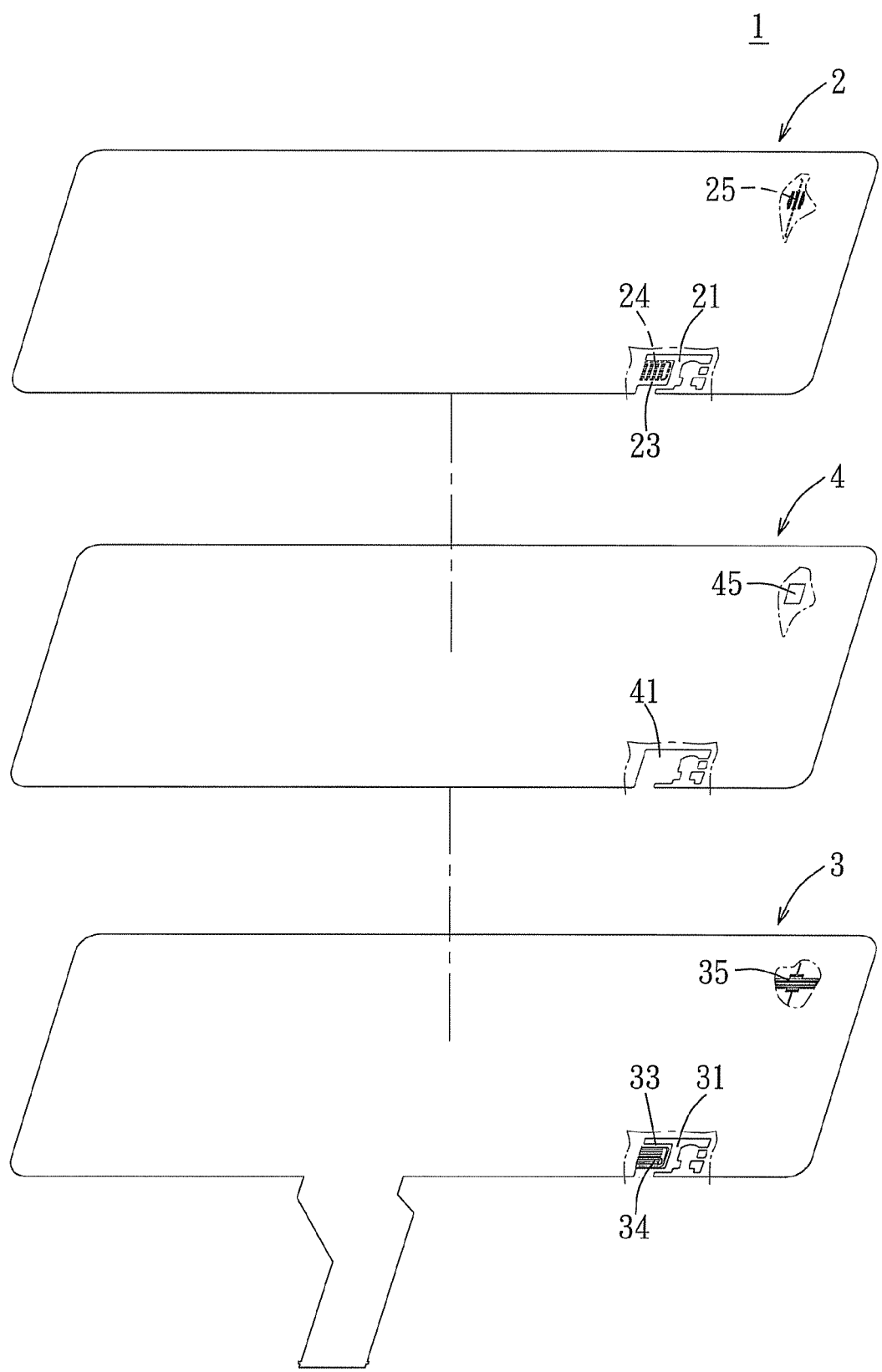
FIG. 2 is an exploded perspective view of the preferred embodiment of a thin film circuit board device for a keyboard according to the present invention.

Referring to FIGS. 2 to 5, the preferred embodiment of a thin film circuit board device 1 according to the present invention is shown to include: a first thin film circuit board 2, a second thin film circuit board 3, and an insulator film 4 disposed between the first and second thin film circuit boards 2, 3. The first thin film circuit board 2 has a first protrusion 23 provided with a first conductive contact 24. The second thin film circuit board 3 has a second protrusion 33 provided with a second conductive contact 34. The first and second protrusions 23, 33 are disposed one above the other. The insulator film 4 is free of a portion that extends between the first and second protrusions 23, 33. The first and second protrusions 23, 33 are folded together (see FIG. 5) in such a manner that the first and second conductive contacts 24, 34 are brought into contact with each other at the fold thereof. As such, the electrical connection between the first and second thin film circuit boards 2, 3 is established without the use of a conductive paste which can deteriorate after a period of time as encountered in the conventional thin film circuit board device.

In this embodiment, the first and second thin film circuit boards 2, 3 and the insulator film 4 are formed with through-holes 21, 31, 41, respectively. The through-hole 21 in the first thin film circuit board 2 is aligned with the through-hole 31 in the second thin film circuit board 3 and the through-hole 41 in the insulator film 4. Each of the first and second protrusions 23, 33 protrudes from a periphery of a respective one of the through-holes 21, 31 in the first and second thin film circuit boards 2, 3 into the respective one of the through-holes 21, 31 in the first and second thin film circuit boards 2, 3.

Figure 6:
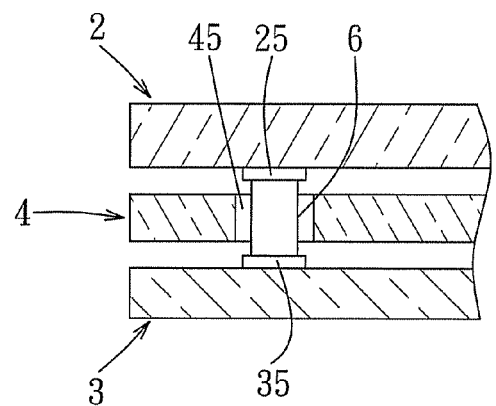
FIG. 6 is a fragmentary cross-sectional view illustrating how two conductive contacts are connected to each other through a conductive paste in the preferred embodiment.

Preferably, the first thin film circuit board 2 has a third conductive contact 25, the second thin film circuit board 3 has a fourth conductive contact 35, and the insulator film 4 is formed with an opening 45 aligned with the third and fourth conductive contacts 25, 35. The thin film circuit board device 1 further includes a conductive paste 6 (see FIG. 6). The third and fourth conductive contacts 25, 35 are connected to each other through the conductive paste 6 located in the opening 45 to bond the third and fourth conductive contacts 25, 35. As such, the electrical connection between the first and second thin film circuit boards 2, 3 has dual protection attributed to the fold of the protrusions 23, 33 and the conductive paste 6.

Figure 3:
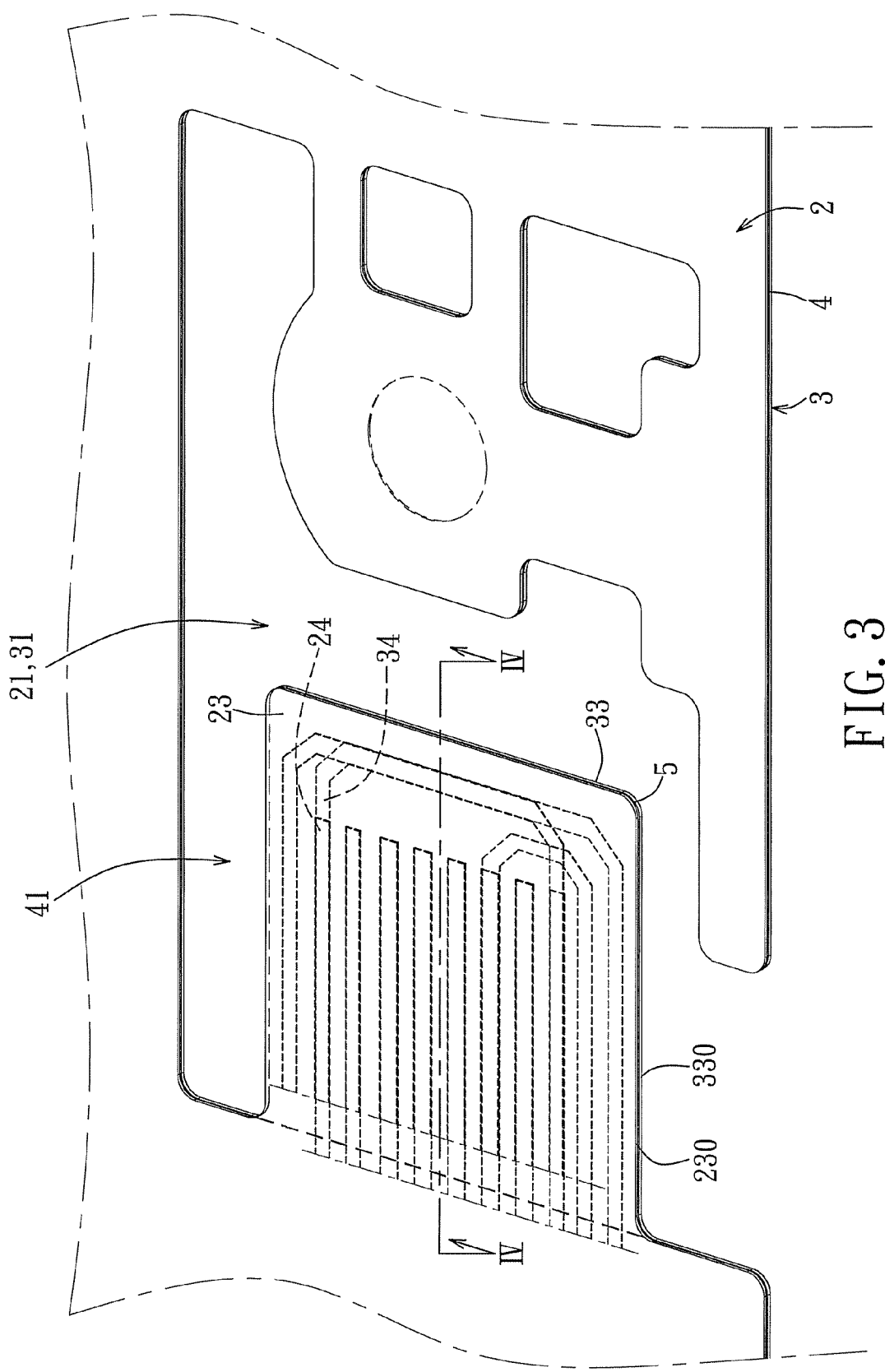
FIG. 3 is a fragmentary enlarged view illustrating configurations of two protrusions of the thin film circuit board device of the preferred embodiment.
Figure 4:
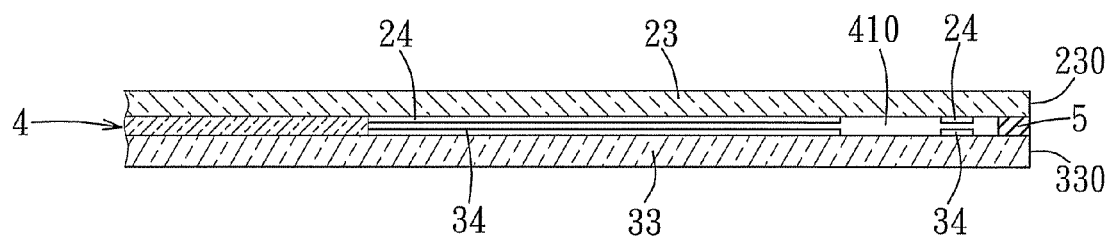
FIG. 4 is a cross-sectional view taken along line IV-IV in FIG. 3.
Figure 5:
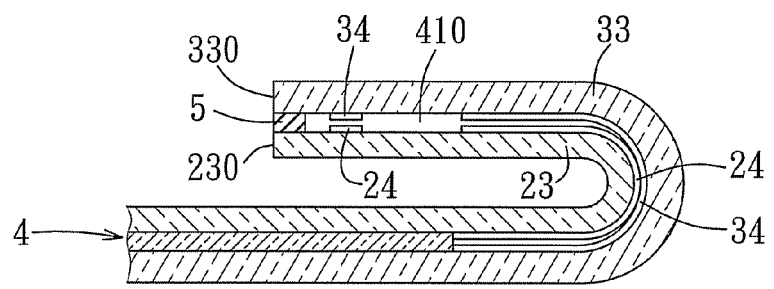
FIG. 5 is a fragmentary cross-sectional view illustrating a state where the protrusions of FIG. 4 are folded together.

In the preferred embodiment, each of the first and second protrusions 23, 33 has a peripheral edge 230, 330 (see FIGS. 3 to 5). The peripheral edges 230, 330 of the first and second protrusions 23, 33 cooperatively define a gap 410 therebetween. The thin film circuit board device 1 further includes a sealant 5, which is made from a waterproof adhesive, received in the gap 410 for sealing the latter.

With the inclusion of the first and second protrusions 23, 33 in the thin film circuit board device 1 of this invention, the aforesaid drawback associated with the prior art can be eliminated. Therefore, the reliability of the thin film circuit board device 1 can be greatly enhanced.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A thin film circuit board device comprising:
   a first thin film circuit board having a first protrusion provided with a first conductive contact;
   a second thin film circuit board having a second protrusion provided with a second conductive contact; and
   an insulator film disposed between said first and second thin film circuit boards;
   wherein said first and second protrusions are disposed one above the other, said insulator film is free of a portion that extends between said first and second protrusions, and said first and second protrusions are folded together in such a manner that said first and second conductive contacts are brought into contact with each other at the fold thereof;
   wherein each of said first and second thin film circuit boards and said insulator film is formed with a through-hole, each of said first and second protrusions protruding from a periphery of said through-hole in a respective one of said first and second thin film circuit boards into said through-hole in the respective one of said first and second thin film circuit boards, said through-hole in said first thin film circuit board being aligned with said through-hole in said second thin film circuit board and said through-hole in said insulator film.

2. The thin film circuit board device of claim 1, wherein said first thin film circuit board further has a third conductive contact, said second thin film circuit board further having a fourth conductive contact, said insulator film being further formed with an opening aligned with said third and fourth conductive contacts, said thin film circuit board device further comprising a conductive paste, said third and fourth conductive contacts being connected to each other through said conductive paste located in said opening.

3. The thin film circuit board device of claim 1, wherein each of said first and second protrusions has a peripheral edge, said peripheral edges of said first and second protrusions cooperatively defining a gap therebetween, said thin film circuit board device further comprising a sealant received in said gap.

* * * * *